US012571819B2

(12) United States Patent
Inoue

(10) Patent No.: US 12,571,819 B2
(45) Date of Patent: Mar. 10, 2026

(54) CURRENT SENSOR

(71) Applicant: Asahi Kasei Microdevices Corporation, Tokyo (JP)

(72) Inventor: Masato Inoue, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 198 days.

(21) Appl. No.: 18/533,210

(22) Filed: Dec. 8, 2023

(65) Prior Publication Data

US 2024/0295585 A1 Sep. 5, 2024

(30) Foreign Application Priority Data

Mar. 3, 2023 (JP) ................................. 2023-033207
Nov. 21, 2023 (JP) ................................. 2023-197145

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01)

(58) Field of Classification Search
CPC . G01R 15/202; G01R 15/207; G01R 19/0092
See application file for complete search history.

(56) References Cited

U.S. PATENT DOCUMENTS

| | | | | | |
|---|---|---|---|---|---|
| 2005/0224248 | A1* | 10/2005 | Gagnon | .................. | H01L 24/37 |
| | | | | | 174/536 |
| 2006/0219436 | A1* | 10/2006 | Taylor | ..................... | H01L 24/37 |
| | | | | | 257/E23.114 |
| 2007/0170533 | A1* | 7/2007 | Doogue | .................. | G01R 33/06 |
| | | | | | 257/422 |
| 2013/0015839 | A1* | 1/2013 | Franke | ................. | G01R 15/202 |
| | | | | | 324/117 H |
| 2013/0020660 | A1* | 1/2013 | Milano | ................ | G01R 15/207 |
| | | | | | 257/E27.005 |
| 2016/0187388 | A1* | 6/2016 | Suzuki | ................. | G01R 15/207 |
| | | | | | 324/244 |

(Continued)

FOREIGN PATENT DOCUMENTS

| | | |
|---|---|---|
| JP | 2002257867 A | 9/2002 |
| JP | 2002286765 A | 10/2002 |

(Continued)

*Primary Examiner* — Dominic E Hawkins

(57) ABSTRACT

A current sensor 100 comprises: a conductor 24 in which a to-be-measured current flows; a magnetoelectric conversion element 34 that is arranged to be separated from the conductor, whose upper surface is positioned below a center of the conductor in a thickness direction in a side view, and the upper surface is positioned above a lower surface of the conductor; a magnetic flux concentrator 36 that is arranged on the upper surface of the magnetoelectric conversion element, whose upper end is positioned above an upper surface of the conductor in a side view, and whose lower end is positioned below the center of the conductor in the thickness direction; a support member 18 that supports the magnetoelectric conversion element; and a package 9 that encapsulates the conductor, the magnetoelectric conversion element, the magnetic flux concentrator, and the support member.

8 Claims, 13 Drawing Sheets

100

(56)     References Cited

U.S. PATENT DOCUMENTS

| | | | | |
|---|---|---|---|---|
| 2020/0132728 | A1 | 4/2020 | Boury | |
| 2020/0381342 | A1* | 12/2020 | Park | G01R 15/202 |

FOREIGN PATENT DOCUMENTS

| | | | | |
|---|---|---|---|---|
| JP | 2003098195 | A | 4/2003 | |
| JP | 2011145273 | A | 7/2011 | |
| WO | WO-2015028185 | A1 * | 3/2015 | G01R 33/0011 |

* cited by examiner

| SUBSTANCE | RELATIVE MAGNETIC PERMEABILITY |
|---|---|
| PERMALLOY | 100000 |
| IRON-COBALT ALLOY (STRIP MATERIAL WITH HIGH MAGNETIC-PERMEABILITY) | 18000 |
| IRON (99.8% PURE IRON) | 5000 |
| (MANGANESE-ZINC-BASED) FERRITE | 640 |
| NICKEL | 100 – 600 |
| CARBON STEEL | 100 |
| (NICKEL-ZINC-BASED) FERRITE | 16–640 |

FIG.2

CURRENT SENSOR

The contents of the following patent application(s) are incorporated herein by reference:

NO. 2023-033207 filed in JP on Mar. 3, 2023
NO. 2023-197145 filed in JP on Nov. 21, 2023

BACKGROUND

1. Technical Field

The present invention relates to a current sensor.

2. Related Art

Known is a current sensor that measures the amount of current by using a magnetoelectric conversion element which is juxtaposed with a conductor to detect a magnetic field that is generated around the conductor as a result of a to-be-measured current flowing through the conductor (for example, see Patent Document 1). In such a current sensor, in order to prevent a dielectric breakdown by securing a withstand voltage between a conductor in which the to-be-measured current is flowing and a magnetoelectric conversion element, a clearance is provided therebetween. However, if the clearance becomes larger, a magnetic flux density on a magnetosensitive surface of the magnetoelectric conversion element is reduced, sensitivity of the current sensor decreases, and the response speed decreases.

Patent Document 1: Japanese Patent Application Publication No. 2015-045634

BRIEF DESCRIPTION OF THE DRAWINGS

FIG. 2 represents a magnetic material and a relative magnetic permeability of a magnetic flux concentrator.

DESCRIPTION OF EXEMPLARY EMBODIMENTS

Hereinafter, the present invention is described by embodiments of the invention, while the embodiments do not limit the invention according to the claims, and all the combinations of the features described in the embodiments are not necessarily essential to means provided by aspects of the invention.

Figure 1A:
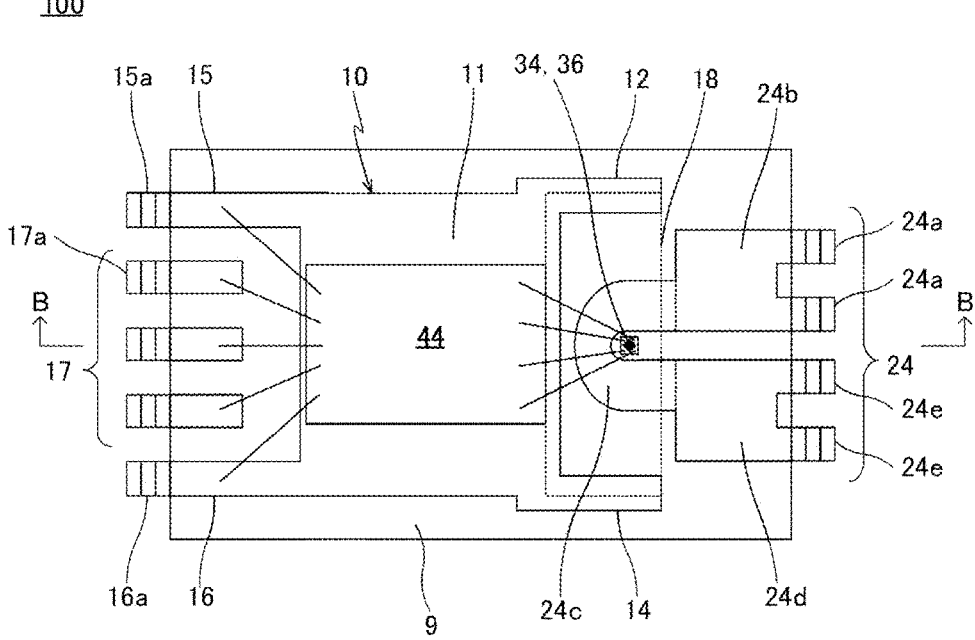
FIG. 1A represents an internal configuration of a current sensor in a top view.
Figure 1B:
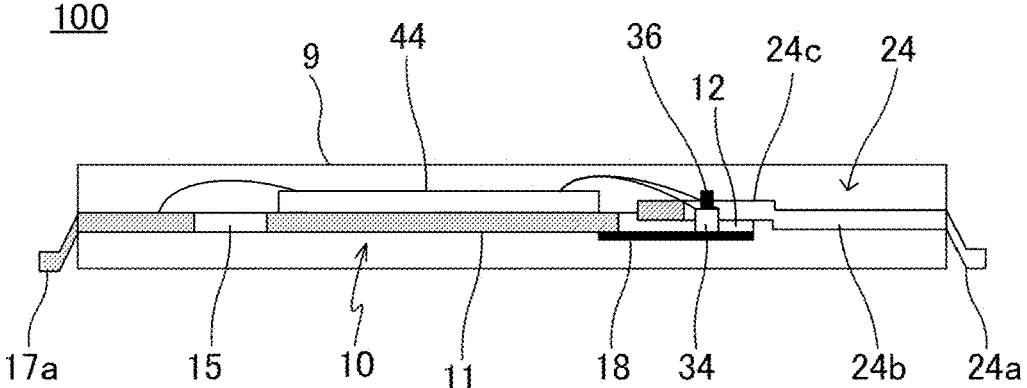
FIG. 1B represents a side view of the internal configuration of the current sensor.

FIG. 1A and FIG. 1B represent an internal configuration of a current sensor 100 in a top view and a side view, respectively, wherein a package 9 is not shown. Here, FIG. 1B represents a cross-sectional structure of the current sensor 100 with respect to a reference line in FIG. 1A. Note that an up-and-down direction in FIG. 1A is referred to as a vertical direction, a left and right direction in FIG. 1A and FIG. 1B is referred to as a horizontal direction, and an up-and-down direction in FIG. 1B is referred to as a height direction. The current sensor 100 is a sensor that measures an amount of current by using a magnetoelectric conversion element 34 to detect a magnetic field that is generated around a conductor 24 as a result of a to-be-measured current flowing therethrough. In particular, the sensitivity is improved by providing a magnetic flux concentrator 36 on a magnetosensitive surface of the magnetoelectric conversion element 34 while securing a withstand voltage by providing a clearance between the conductor 24 and the magnetoelectric conversion element 34, and furthermore, a response speed is improved by improving a cut-off frequency by reducing a gain factor of an amplifier circuit in order to provide a desired sensitivity as a current sensor. The current sensor 100 includes a package 9, a frame 10, a plurality of device terminals 17, a support member 18, a conductor 24, a magnetoelectric conversion element 34, a magnetic flux concentrator 36, and a signal processing device 44.

The package 9 is a member that protects each component of the current sensor 100, except for two device terminals 15, 16 of the frame 10, a plurality of device terminals 17, and each terminal portion of the conductor 24 described below, by encapsulating them inside itself. The package 9 is formed of an encapsulating resin with a good insulating property such as epoxy, for example, that is shaped into a flat cuboid by molding.

The frame 10 is a board-shaped member supporting a signal processing device 44 and having the support member 18 fixed thereto. The frame 10 is formed of a metal with a high thermal conductivity that is shaped into a board, for example, especially in order to dissipate the heat emitted by the signal processing device 44. The frame 10 includes a body 11, protruding portions 12, 14, and device terminals 15, 16.

The body 11 is a portion that supports the signal processing device 44. The body 11 has a substantially rectangular shape with a sufficient size for supporting the signal processing device 44 in a planar view, as an example.

The protruding portions 12, 14 are portions to which the support member 18 is fixed. The protruding portions 12, 14 extend rightward from one end (that is, the upper end in FIG. 1A) of one side (that is, the right side in FIG. 1A) of the body 11 in a horizontal direction and the other end (that is, the lower end in FIG. 1A), respectively.

The device terminals 15, 16 are portions that output, to an external device, a detection result of the to-be-measured current output from the signal processing device 44. The device terminals 15, 16 extend leftward from one end (that is, the upper end in FIG. 1A) and the other end (that is, the lower end in FIG. 1A) of the other side (that is, the left side in FIG. 1A) of the body 11 in a horizontal direction. The device terminals 15, 16 form terminal portions 15a, 16a on each of their end portions by bending their end portions downward and further causing their edges bent to be positioned horizontally by a bending process.

The frame 10 encapsulates terminal portions 15a, 16a of the device terminals 15, 16 within the package 9 by protruding them from a side surface of the package 9.

As with the device terminals 15, 16, the plurality of device terminals 17 are secondary conductors that output, to an external device, a detection result of the to-be-measured current output from the signal processing device 44. Furthermore, as with the device terminals 15, 16, the plurality of device terminals 17 are used for providing a power supply or an operational parameter to the signal processing device 44. In the present embodiment, as an example, three device terminals 17 are arranged at equal intervals between the device terminals 15, 16 of the frame 10 with their longer side directed to the horizontal direction. The device terminals 17 is formed of a metal that is shaped into a rectangular board, and similar to the device terminals 15, 16, forms a terminal portion 17a on their end portions by bending their end portions downward and further causing their edges bent to be positioned horizontally by a bending process.

The support member 18 is a sheet or film with a rectangular shape for supporting the magnetoelectric conversion element 34, and may be formed of a raw material with a high insulation breakdown voltage such as a polyimide tape as an example. An example of a support member that is not an insulating member includes a silicon, copper with the shape of a board, for example. With a support member made of solid silicon or copper, the support member 18 is not deflected. Accordingly, the misalignment of the magneto-electric conversion element 34 and the conductor 24 can be suppressed. The support member 18 is held on the frame 10, by making its longer side directed in a vertical direction and making one end and the other end of the longer side attached to lower surfaces of the protruding portions 12, 14 of the frame 10, respectively, which causes it to be suspended between the protruding portions 12, 14.

The conductor 24 is a primary conductor that forms a current path in which the to-be-measured current is flowing. In the present embodiment, the conductor 24 has a substantially U-shape that enters into the package 9 from a current terminal 24a provided on one side (that is, the upper side of FIG. 1A) of the right side of the package 9 and returns to the right side by passing through an interior of the package 9, and leading to a current terminal 24e provided on the other side (that is, the lower side of FIG. 1A) of the right side. The conductor 24 is shaped by using a metal. The conductor 24 includes current terminals (also simply referred to as a terminal portion) 24a, 24e, barrels 24b, 24d, and a curved portion 24c.

Each of the terminal portions 24a, 24e forms a terminal for inputting a current, by protruding from the right side of the package 9, bending their end portion downward by a bending process, and further bending the edge to be positioned horizontally.

The barrels 24b, 24d are portions connecting the terminal portions 24a, 24e to the curved portion 24c. As an example, the barrels 24b, 24d are formed in a rectangular shape, separately connected to two barrels 24a, 24e on the right side, and connected to a leg portion of the curved portion 24c on the left side.

The curved portion 24c includes two leg portions, and a joining portion for joining the two leg portions. Each of the two leg portions includes a width less than that of each of the barrels 24b, 24d in a vertical direction. The joining portion of the curved portion 24c curves in a substantially arc-shape, with two leg portions extending in a horizontal direction from the both ends.

Here, a separation distance of the two leg portions in the vertical direction is greater than a width of the magneto-electric conversion element 34. Note that the curved portion 24c may be bent to have a rectangular U-shape.

Here, the curved portion 24c of the conductor 24 is positioned upper than the barrels 24b, 24d by providing a step in a height direction with a step processing (for example, half die cutting, etching, forming, coining and the like). In this way, the bottom surface of the curved portion 24c is positioned upper than the upper surface of the support member 18 that is attached to the bottom surface of the protruding portions 12, 14 of the frame 10, and by separating a primary conductor including the conductor 24 from a support member 18 that is connected to a secondary conductor including the device terminals 15, 16, 17, a high insulation breakdown voltage between the primary conductor and the secondary conductor within the package 9 is obtained.

The conductor 24 is encapsulated within the package 9 by disposing the curved portion 24c between the protruding portions 12, 14 of the frame 10 and protruding the edges of the terminal portions 24a, 24e from the right side of the package 9.

The magnetoelectric conversion element 34 is a sensor that detects a magnetic field generated by a to-be-measured current supplied by the conductor 24. As the magnetoelectric conversion element 34, for example, a compound semiconductor Hall element configured from InAs, GaAs, and the like, a Hall element configured from silicone, and a magneto-resistance can be adopted.

The magnetoelectric conversion element 34 is arranged, on the support member 18, to be separated from the conductor 24 in a region that is surrounded by the curved portion 24c of the conductor 24 in a top view. Here, the magnetosensitive surface (that is, a detection surface for detecting a magnetic field) of the magnetoelectric conversion element 34 is provided on the upper surface of the magnetoelectric conversion element 34 in the present embodiment. The magnetoelectric conversion element 34 is positioned to have its upper surface to be positioned below the center of the conductor 24 in a thickness direction in a side view. The magnetoelectric conversion element 34 is connected to the signal processing device 44 by a wire bonding, to output a voltage in accordance with the intensity of the detected magnetic field to the signal processing device 44 as an output signal.

Note that the upper surface of the magnetoelectric conversion element 34 may be positioned to be disposed below the lower surface of the conductor 24 in a side view. In this way, the insulating property can be improved by separating the conductor 24 and the support member 18.

FIG. 2 represents a magnetic material and a relative magnetic permeability of a magnetic flux concentrator 36. The magnetic flux concentrator 36 is a chip-like magnetic material that concentrates, on the magnetosensitive surface of the magnetoelectric conversion element 34, the magnetic field generated by the current supplied to the conductor 24. The magnetic flux concentrator 36 is formed of a magnetic material having a high relative magnetic permeability p, for example, 10-100,000. As the magnetic material, at least one of permalloy, iron-cobalt alloy, iron, ferrite, nickel, and carbon steel can be adopted, for example.

The magnetic flux concentrator 36 is arranged on the upper surface of the magnetoelectric conversion element 34. Here, the lower end of the magnetic flux concentrator 36 is bonded to the upper surface of the magnetoelectric conversion element 34 by using an adhesive such as silicone resin. The magnetic flux concentrator 36 is shaped to be a prism-shape having an upper surface and a bottom surface with a rhomboidal shape (which may also be a circular shape, a rectangular shape and the like) which is smaller than the magnetosensitive surface of the magnetoelectric conversion element 34, as an example. Furthermore, the magnetic flux concentrator 36 may be arranged to have its upper end positioned above the upper surface of the conductor 24 in a side view.

The signal processing device 44 is a device that calculates an amount of the to-be-measured current supplied to the conductor 24 by processing the output signal of the magnetoelectric conversion element 34. The signal processing device 44 may incorporate a memory, a sensitivity correction circuit, an offset correction circuit for correcting an offset of an output, an amplifier circuit for amplifying an output signal from the magnetoelectric conversion element 34, and a temperature correction circuit for correcting the output according to the temperature. The signal processing device 44 is supported on the body 11 of the frame 10, and connected to the device terminals 15, 16 and three device terminals 17 of the frame 10 by a wire bonding. In this way, the signal processing device 44 outputs, via the device terminals 15, 16, 17, a calculation result of the amount of the to-be-measured current supplied to the conductor 24.

Figure 3A:
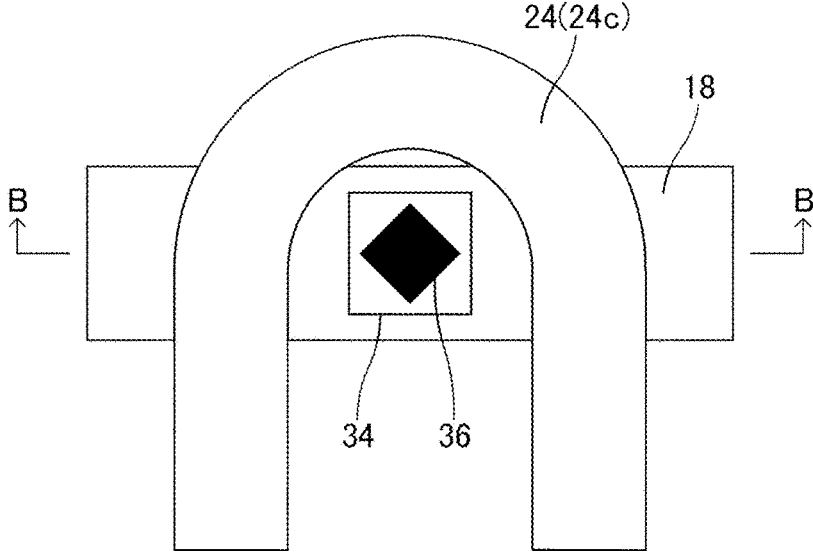
FIG. 3A represents an arrangement of a magnetoelectric conversion element and a magnetic flux concentrator of a conductor in a top view.
Figure 3B:
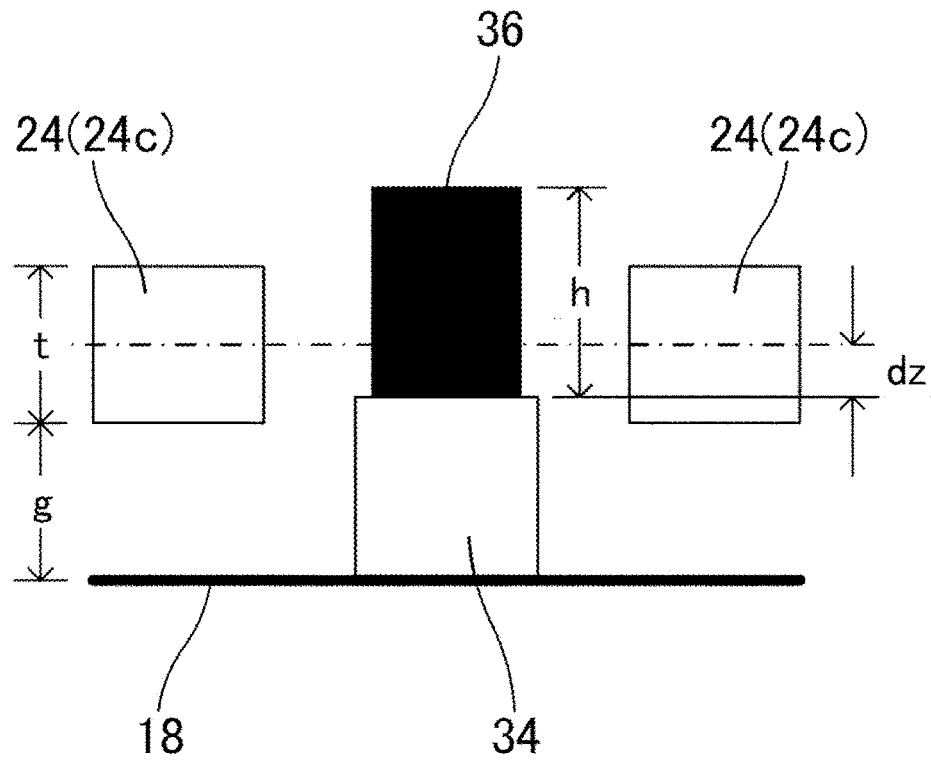
FIG. 3B represents an arrangement of a magnetoelectric conversion element and a magnetic flux concentrator of a conductor in a side view.

FIG. 3A and FIG. 3B represent the arrangement of the magnetoelectric conversion element 34 and the magnetic flux concentrator 36 with respect to the curved portion 24$c$ of the conductor 24 in a top view and a side view, respectively. Here, FIG. 3B is a side view related to a reference line BB in FIG. 3A. As described above, the magnetoelectric conversion element 34 is arranged, on the support member 18, to be separated from the curved portion 24$c$ on a region that is surrounded by the curved portion 24$c$ of the conductor 24 in a top view, and the magnetic flux concentrator 36 is arranged at the center of the upper surface of the magnetoelectric conversion element 34. Here, a thickness of the curved portion 24$c$ of the conductor 24 is referred to as a thickness t, a separation distance (clearance) between the curved portion 24$c$ of the conductor 24 and the support member 18 is referred to as a separation distance g, a height of the magnetic flux concentrator 36 is referred to as a height h, and a distance from the center of the conductor 24 to the upper surface of the magnetoelectric conversion element 34 in a thickness direction is referred to as a distance dz. Note that a sign of the distance dz is positive when the upper surface of the magnetoelectric conversion element 34 is positioned below the center of the conductor 24 in the thickness direction in a side view.

Figure 4A:
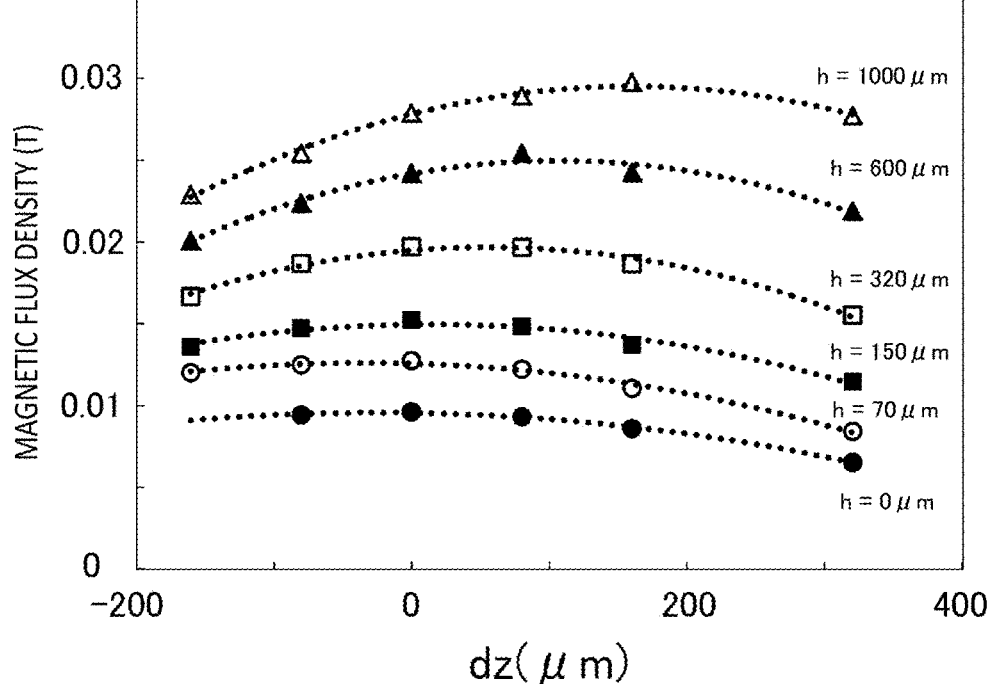
FIG. 4A represents, for each height of a magnetic flux concentrator, a relationship between a position on an upper surface of a magnetoelectric conversion element relative to the center of a conductor in a thickness direction and a magnetic flux density on the upper surface.

FIG. 4A represents, for each height h of a magnetic flux concentrator 36, a relationship between a distance dz on an upper surface of a magnetoelectric conversion element 34 relative to the center of a conductor 24 in a thickness direction and a magnetic flux density on the upper surface. Here, by a simulation using a finite element method, a magnetic flux density of the magnetic flux, which is concentrated by the magnetic flux concentrator 36 and enters onto the upper surface of the magnetoelectric conversion element 34 when a voltage 0.01V is applied to be supplied between the terminal portions 24$a$, 24$e$ of the conductor 24, is calculated. The width W of the conductor 24=420 μm and the thickness t=250 μm, the relative magnetic permeability p of the magnetic flux concentrator 36=5000, the height h of the magnetic flux concentrator 36=0, 70, 150, 320, 600, 1000 μm.

When the height h of the magnetic flux concentrator 36=0 μm, that is, the magnetic flux concentrator 36 is a thin film, the magnetic flux density on the upper surface of the magnetoelectric conversion element 34 exhibits a local maximum at a distance dz=0 μm, and decreases as the upper surface of the magnetoelectric conversion element 34 being separated from the center of the conductor 24.

When the height h of the magnetic flux concentrator 36=70 μm, the magnetic flux density on the upper surface of the magnetoelectric conversion element 34 increases as the distance dz increases, that is, the upper surface of the magnetoelectric conversion element 34 is separated further below the center of the conductor 24, exhibits a local maximum at dz=−40 μm, and furthermore, it decreases as the distance dz increases.

When the height h of the magnetic flux concentrator 36=150 μm, the magnetic flux density on the upper surface of the magnetoelectric conversion element 34 increases as the distance dz increases, that is, the upper surface of the magnetoelectric conversion element 34 is separated further below the center of the conductor 24, exhibits a local maximum at dz=15 μm, and furthermore, it decreases as the distance dz increases.

When the height h of the magnetic flux concentrator 36=320, 600, 1000 μm, the magnetic flux density exhibits a behavior similar to that of the case where h=150 μm, each exhibits a local maximum at dz=55, 110, 160 μm.

Figure 4B:
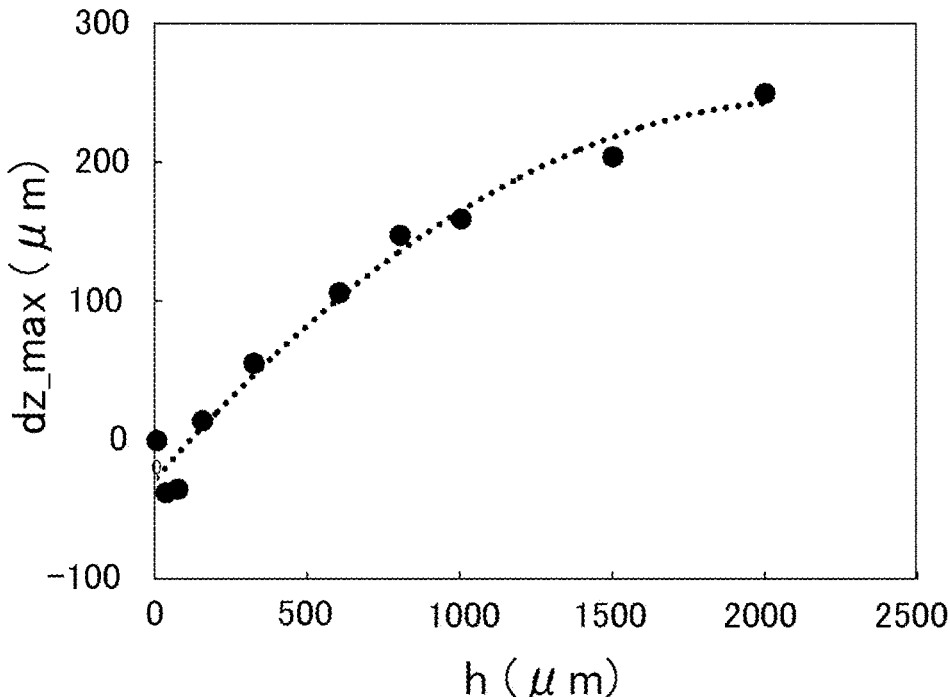
FIG. 4B represents a relationship of a position of an upper surface of a magnetoelectric conversion element to which a local maximum of a magnetic flux density with respect to the height of a magnetic flux concentrator is provided.

FIG. 4B represents a relationship of a distance dz_max of an upper surface of a magnetoelectric conversion element to which a local maximum of a magnetic flux density with respect to the height h of a magnetic flux concentrator 36 is provided. If the height h of the magnetic flux concentrator 36<150 μm, the dz_max represents a negative value. That is, the magnetic flux density on the upper surface of the magnetoelectric conversion element 34 increases by positioning the upper surface of the magnetoelectric conversion element 34 above the center of the conductor 24. If the height h of the magnetic flux concentrator 36≥150 μm, the dz_max represents a positive value, and increases with the height h. Since the thickness t of the conductor 24=250 μm, by selecting a distance dz in which a dz_max>0 with respect to a height h of a given magnetic flux concentrator 36, the clearance g increases, and both a withstand voltage and sensitivity can be improved together. In particular, a pressure resistance is improved by causing the clearance g to be greater than the height of the magnetoelectric conversion element 34. Furthermore, the reliability is improved by separating the magnetoelectric conversion element 34 from the conductor 24 that is a heat source, which causes a mold resin that forms the package 9 to easily flow into the support member 18 and the conductor 24, to improve the embeddability. Note that the upper surface of the magnetoelectric conversion element can be made small by reducing the package height by positioning itself above the lower surface of the conductor.

Figure 5A:
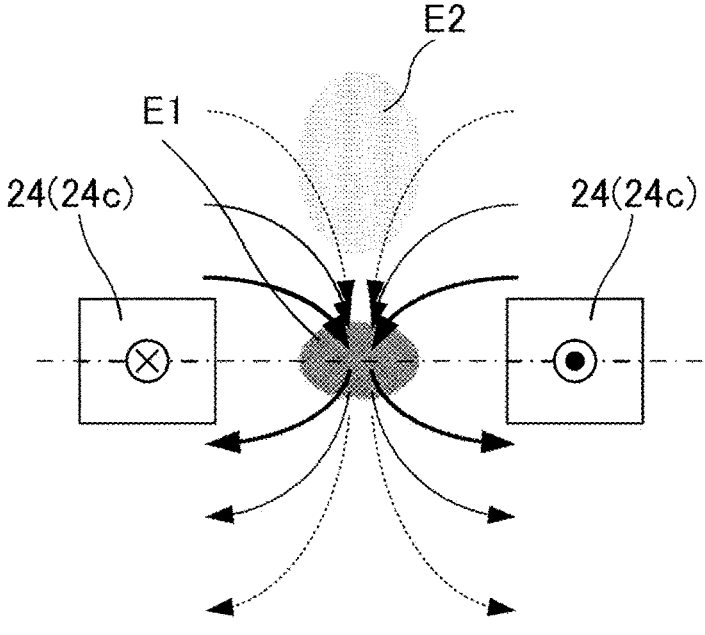
FIG. 5A schematically represents a distribution of a magnetic field that is generated as a result of a to-be-measured current flowing through a conductor.

FIG. 5A schematically represents a distribution of a magnetic field that is generated as a result of a to-be-measured current flowing through a conductor 24. If the conductor 24 is energized, a magnetic flux is generated around each of the two leg portions of the curved portion 24c of the conductor 24. The magnetic flux is converged at the center between the two leg portions from above the leg portions, exits downward, and is directed below the two leg portions. Therefore, the magnetic flux density increases in a region E1 at the center of the conductor 24. Note that this region volume is small. Also, the magnetic flux density relatively increases in the region E2 above the center of conductor 24. Note that this region volume is large, and the magnetic flux density decreases in proportion to a square of a distance from the conductor 24.

Figure 5B:
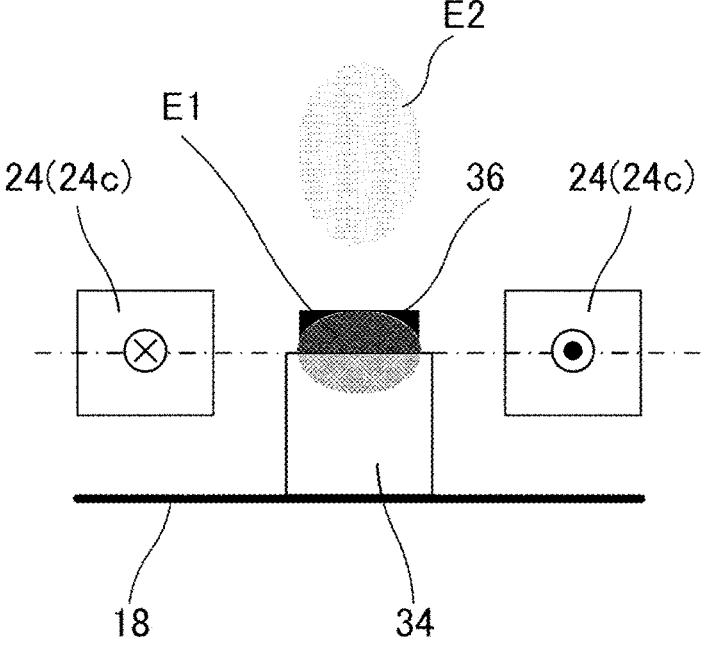
FIG. 5B represents an example of a magnetic field that is concentrated by a short magnetic flux concentrator.

FIG. 5B represents an example of a magnetic field that is concentrated by a short magnetic flux concentrator 36. When the height h of the magnetic flux concentrator 36 in the result of the above-described simulation=0, 70 μm, since the height is less than the thickness t of the conductor 24, the magnetic flux within the region E1 is concentrated on the upper surface of the magnetoelectric conversion element 34 at a position (dz is approximately zero or less than zero) in which the magnetic flux concentrator 36 only covers the region. In this way, a local maximum of the magnetic flux density is obtained.

Figure 5C:
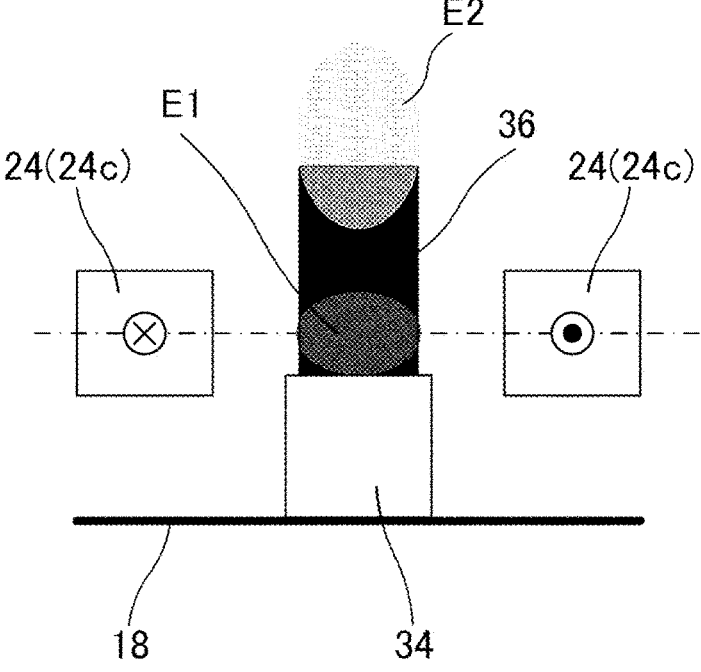
FIG. 5C represents an example of a magnetic field that is concentrated by a long magnetic flux concentrator.

FIG. 5C represents an example of a magnetic field that is concentrated by a long magnetic flux concentrator 36. When the height h of the magnetic flux concentrator 36 in the result of the above-described simulation=320, 600, 1000 μm, since the height is greater than the thickness t of the conductor 24, the magnetic flux within the region E1 as well as the region E2 above the region E1 is concentrated on the upper surface of the magnetoelectric conversion element 34 at a position (dz>0) in which the magnetic flux concentrator 36 covers those regions. In this way, a local maximum of the magnetic flux density is obtained. As the height h increases, the magnetic flux density on the upper surface of the magneto-electric conversion element 34 further increases with the magnetic flux concentrator 36 concentrating the magnetic flux from a larger region.

Therefore, the upper surface (that is, the magnetosensitive surface) of the magnetoelectric conversion element is preferably positioned below the center of the conductor 24 in a thickness direction (dz>0) so that the magnetic flux concentrator 36 arranged on the upper surface covers the region E1 at the center of the conductor 24 in which a high magnetic flux density is obtained. Furthermore, the height h of the magnetic flux concentrator 36 is preferably defined to position the upper end above the upper surface of the conductor 24, so that the magnetic flux concentrator 36 covers the region E2 above the conductor 24 in which a relatively high magnetic flux density is obtained. In this way, the magnetic field sensitivity of the magnetoelectric conversion element 34 is improved. Furthermore, the upper surface of the magnetoelectric conversion element 34 is preferably positioned below the lower surface of the conductor 24 (the clearance g is large). In this way, the pressure resistance is improved by separating the conductor 24 and the support member 18.

Figure 6A:
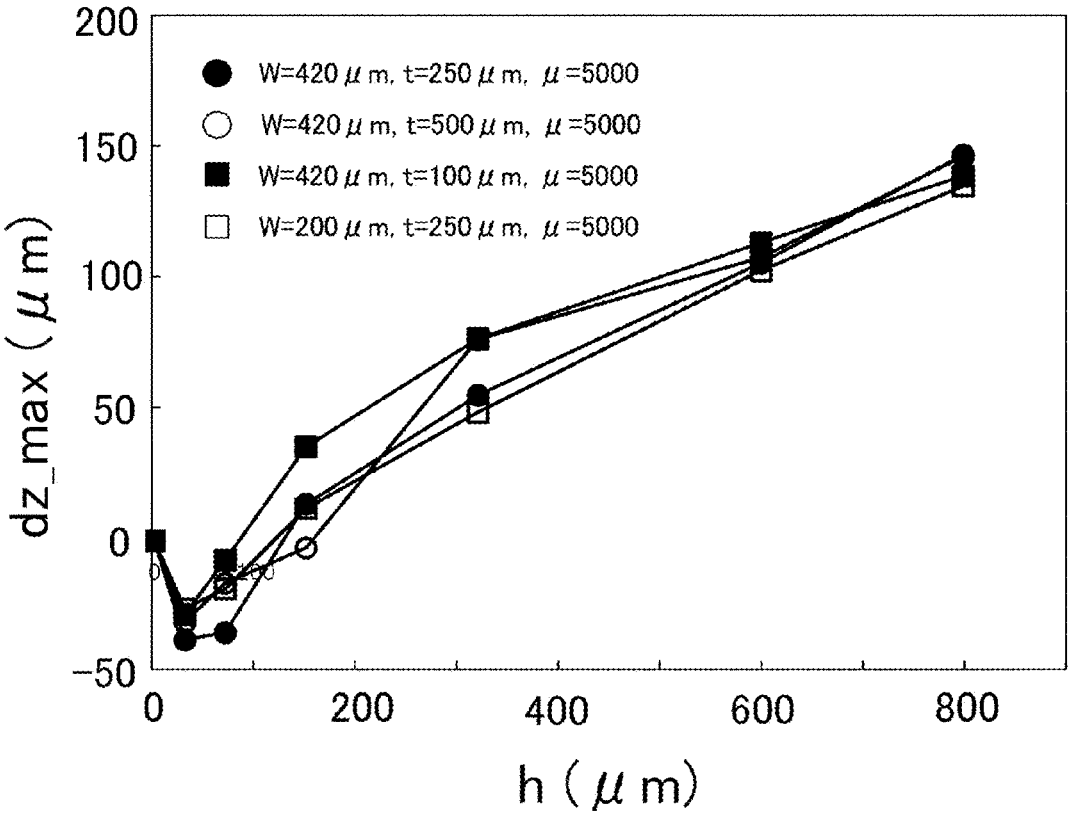
FIG. 6A represents, for each of the width and the thickness of the conductor, a relationship of a position on an upper surface of a magnetoelectric conversion element to which a local maximum of a magnetic flux density with respect to the height of a magnetic flux concentrator is provided.

FIG. 6A represents, for each of the width W and the thickness t of the conductor 24, a relationship of the position dz_max of the upper surface of the magnetoelectric conversion element 34 to which a local maximum of a magnetic flux density with respect to the height h of the magnetic flux concentrator 36 is provided. Here, the width W of the conductor 24=200, 420 μm, the thickness t=100, 250, 500 μm, and the relative magnetic permeability μ=5000. A position dz_max on the upper surface of the magnetoelectric conversion element to which a local maximum of the magnetic flux density is provided exhibits a positive value within a numerical precision range and h≥150 μm or more, without much dependence on the width W and the thickness t of the conductor 24. Since the magnetic flux from a large region is concentrated on the upper surface of the magnetoelectric conversion element 34 by arranging the magnetic flux concentrator 36 on the magnetoelectric conversion element 34 and covering the region E1 at the center of the conductor 24 as well as the region E2 above the region E1, unless a magnetic flux density distribution around the conductor 24 is changed, it can be seen that a relationship of the position dz_max on the upper surface of the magnetoelectric conversion element to which the local maximum of the magnetic flux density is provided with respect to the height h of the magnetic flux concentrator 36 is insensitive to the width W and the thickness t of the conductor 24.

Figure 6B:
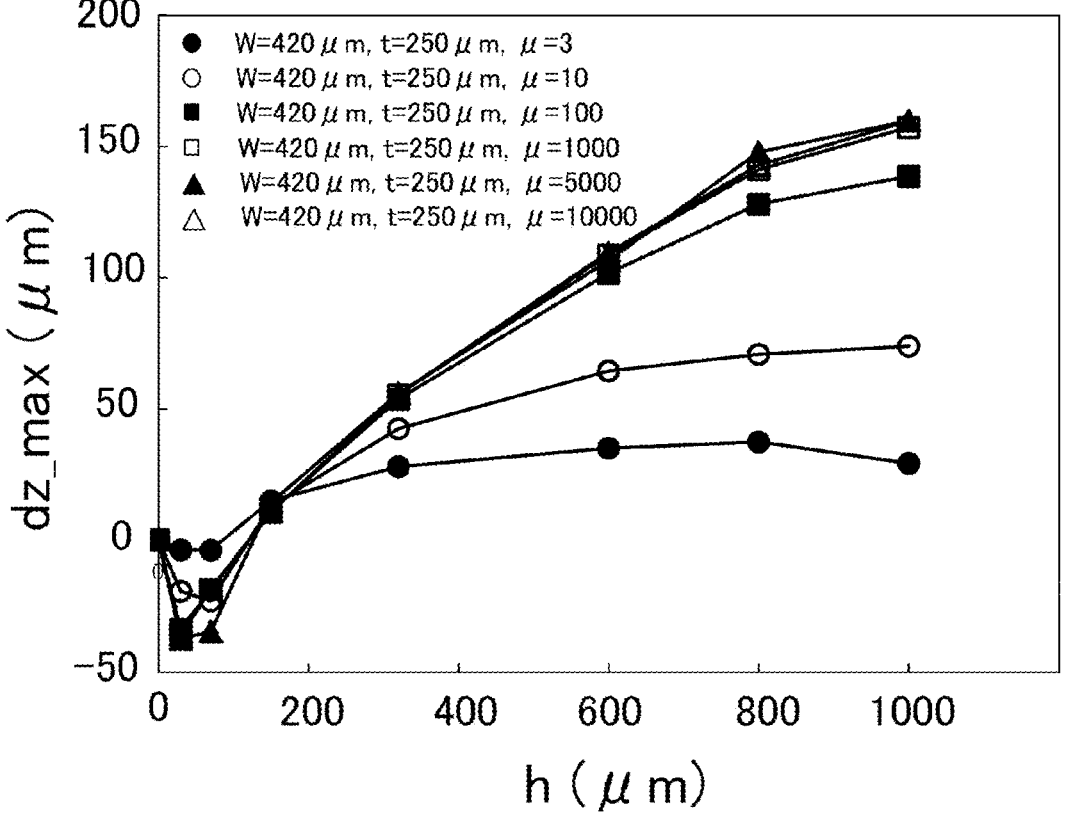
FIG. 6B represents, for each magnetic permeability of a magnetic flux concentrator, a relationship of a position of an upper surface of a magnetoelectric conversion element to which a local maximum of a magnetic flux density with respect to the height of the magnetic flux concentrator is provided.

FIG. 6B represents, for each magnetic permeability (relative magnetic permeability μ) of a magnetic flux concentrator 36, a relationship of a position dz_max of an upper surface of a magnetoelectric conversion element 34 to which a local maximum of a magnetic flux density with respect to the height h of the magnetic flux concentrator 36 is provided. Here, the width W of the conductor 24=420 μm, the thickness t=250 μm, and the relative magnetic permeability μ=3, 10, 100, 1000, 5000, 100000. If a relative magnetic permeability p has a small value, there is virtually no magnetic flux concentrator 36, and therefore the position dz_max on the upper surface of the magnetoelectric conversion element to which the local maximum of the magnetic flux density is provided approaches closer to zero, that is, becomes closer to the center of the conductor 24 in a thickness direction. If a relative magnetic permeability p has a large value, it means that a magnetic flux from a wide range is converged on the magnetic flux concentrator 36, and therefore the position dz_max on the upper surface of the magnetoelectric conversion element to which the local maximum of the magnetic flux density is provided becomes a large positive value, that is, positioned below the center of the conductor 24 in the thickness direction. With the dz_max>0 for the relative magnetic permeability μ≥10 and the height h≥150 μm, both the withstand voltage and the sensitivity can be improved together.

Figure 7:
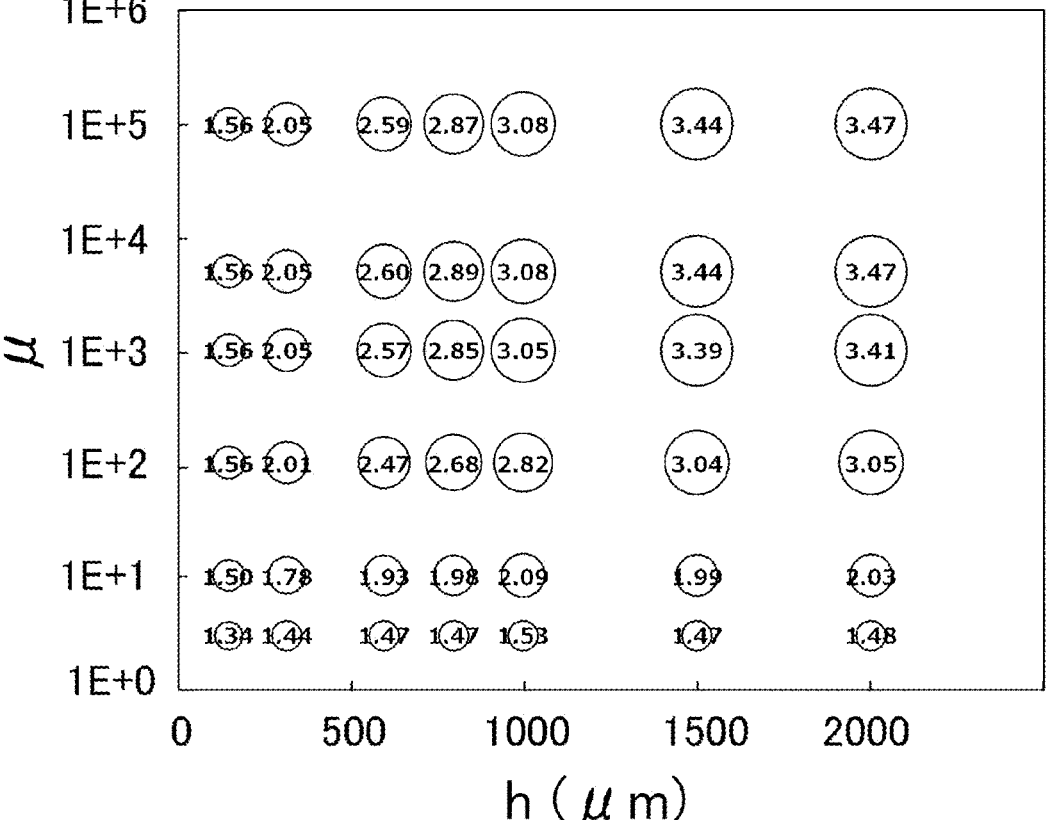
FIG. 7 represents a magnetic flux concentrating rate on an upper surface of a magnetoelectric conversion element with respect to the height and a magnetic permeability of a magnetic flux concentrator.

FIG. 7 represents a magnetic flux concentrating rate on an upper surface of a magnetoelectric conversion element 34 with respect to the height h and a relative magnetic permeability p of a magnetic flux concentrator 36. The magnetic flux concentrating rate is provided as a multiplication factor with respect to a magnetic flux density on the upper surface of the magnetoelectric conversion element 34 in a case in which the magnetic flux concentrator 36 is not provided on the magnetoelectric conversion element 34 (that is, the relative magnetic permeability μ=0). The relative magnetic permeability μ is selected within a range of the relative magnetic permeability 10-100,000 of a material given in FIG. 2. The height h of the magnetic flux concentrator is selected within a range of 150 μm or more that provides the dz_max>0 and a typical thickness of 2000 μm of the package 9 of the current sensor 100. For the relative magnetic permeability μ=10, a magnetic flux concentrating rate is 1.50-2.03 within the range of the height h=150-2000 μm. For the relative magnetic permeability μ=100,000, a magnetic flux concentrating rate is 1.56-3.47 within the range of the height h=150-2000 μm. Therefore, the height h of the magnetic flux concentrator 36 is preferably 150 μm or more and less than the thickness (for example, 2000 μm or 1000 μm of its half) of the package 9.

The current sensor 100 according to the present embodiment includes a conductor 24 in which a to-be-measured current flows, a magnetoelectric conversion element 34 that is arranged to be separated from the conductor 24, whose upper surface is positioned below the center of the conductor 24 in a thickness direction in a side view, and the upper surface is positioned above a lower surface of the conductor 24, a magnetic flux concentrator 36 that is arranged on the upper surface of the magnetoelectric conversion element 34, whose upper end is positioned above the upper surface of the conductor 24 in a side view, and whose lower end is positioned below the center of the conductor 24 in a thickness direction, a support member 18 that supports the magnetoelectric conversion element 34, and a package 9 that encapsulates the conductor 24, the magnetoelectric conversion element 34, the magnetic flux concentrator 36 and the support member 18. Accordingly, by arranging the magnetoelectric conversion element 34 to be separated from the conductor 24, and arranging the magnetoelectric conversion element 34 with its upper surface to be positioned below the center of the conductor 24 in a thickness direction in a side view and with its upper surface to be positioned above the lower surface of the conductor 24, and by arranging the magnetic flux concentrator 36 on the upper surface of the magnetoelectric conversion element 34, and arranging the magnetic flux concentrator 36 with its upper end to be positioned above the upper surface of the conductor 24 in a side view and with its lower end to be positioned below the center of the conductor 24 in a thickness direction, the magnetic flux concentrator 36 can concentrate, on a magnetosensitive surface of the magnetoelectric conversion element 34, a magnetic flux that is concentrated at the center of the conductor 24 in a side view as well as a magnetic flux that is distributed above the conductor. In this way, the magnetic field sensitivity (that is, the response speed) can be improved.

Note that, in the current sensor 100 of the present embodiment, the current supplied to the conductor 24 may be a direct current or may be an alternating current. Also, in the case of a direct current, the current being supplied may be defined to be any orientation.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

9 package
10 frame
11 body
12, 14 protruding portion
15, 16, 17 device terminal
15a. 16a, 17a terminal portion
18 support member
24 conductor
24a, 24e current terminal (terminal portion)
24b, 24d barrel
24c curved portion
34 magnetoelectric conversion element
36 magnetic flux concentrator
44 signal processing device
100 current sensor
E1, E2 region
μ relative magnetic permeability.

What is claimed is:

1. A current sensor comprising:
a conductor in which a to-be-measured current flows;
a magnetoelectric conversion element that is arranged to be separated from the conductor, whose upper surface is positioned below a center of the conductor in a thickness direction in a side view, and the upper surface is positioned above a lower surface of the conductor;
a magnetic flux concentrator that is arranged on the upper surface of the magnetoelectric conversion element, whose upper end is positioned above an upper surface of the conductor in the side view, and whose lower end is positioned below the center of the conductor in the thickness direction;
a support member including a flat surface that supports the magnetoelectric conversion element; and
a package that encapsulates the conductor, the magnetoelectric conversion element, the magnetic flux concentrator, and the support member,
wherein, in the side view, a thickness of the magnetoelectric conversion element is larger than a height from the flat surface of the support member to the lower surface of the conductor.

2. The current sensor according to claim 1, wherein a height h of the magnetic flux concentrator is 150 μm or more and less than a thickness of the package.

3. The current sensor according to claim 2, wherein a relative magnetic permeability μ of the magnetic flux concentrator is 10-100,000.

4. The current sensor according to claim 1, wherein the magnetic flux concentrator is formed of a magnetic material with a high relative magnetic permeability, and the magnetic material includes at least one of permalloy, iron-cobalt alloy, iron, ferrite, nickel, and carbon steel.

5. The current sensor according to claim 1, wherein the lower end of the magnetic flux concentrator is bonded to the upper surface of the magnetoelectric conversion element.

6. The current sensor according to claim 1, wherein the lower end of the magnetic flux concentrator is bonded to the upper surface of the magnetoelectric conversion element by using a silicone resin.

7. The current sensor according to claim 1, wherein
the conductor has a shape that enters from one side of the
 package and returns to the one side by passing through
 an interior of the package in a top view; and
the magnetoelectric conversion element is arranged in a  5
 region that is surrounded by the conductor in the top
 view.

8. The current sensor according to claim 1, further com-
prising:
a signal processing device that processes an output signal  10
 of the magnetoelectric conversion element; and
a frame that supports the signal processing device and has
 the support member fixed thereto.

\*   \*   \*   \*   \*